United States Patent
Lee

(10) Patent No.: US 9,019,768 B1
(45) Date of Patent: Apr. 28, 2015

(54) SPLIT PAGE 3D MEMORY ARRAY

(71) Applicant: Macronix International Co., Ltd., Hsinchu (TW)

(72) Inventor: Guan-Ru Lee, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/062,487

(22) Filed: Oct. 24, 2013

(51) Int. Cl.
| | |
|---|---|
| *G11C 16/04* | (2006.01) |
| *G11C 16/26* | (2006.01) |
| *G11C 5/06* | (2006.01) |
| *H01L 27/115* | (2006.01) |
| *G11C 11/56* | (2006.01) |

(52) U.S. Cl.
CPC ...... *G11C 16/0483* (2013.01); *H01L 27/11551* (2013.01); *H01L 27/11578* (2013.01); *G11C 5/06* (2013.01); *G11C 11/5642* (2013.01); *G11C 16/0408* (2013.01); *G11C 16/04* (2013.01)

(58) Field of Classification Search
CPC ........... G11C 16/0483; G11C 11/5642; G11C 16/0408; G11C 5/06; G11C 16/26; G11C 16/04
USPC ............... 365/185.17, 185.18, 185.05, 51, 63
See application file for complete search history.

(56) References Cited

U.S. PATENT DOCUMENTS

| | | |
|---|---|---|
| 2012/0182806 A1 | 7/2012 | Chen et al. |
| 2014/0269077 A1 | 9/2014 | Shih et al. |
| 2015/0009757 A1* | 1/2015 | Hu et al. .................. 365/185.17 |

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)", Jun. 12-14, 2012, 2012 Symposium on VLSI Technology (VLSIT), pp. 91-92.
Lue et al. "A Novel Dual-Channel 3D NAND Flash Featuring both N-Channel and P-Channel NAND Characteristics for Bit-alterable Flash Memory and a New Opportunity in Sensing the Stored Charge in the WL Space," 2013 IEEE Int'l Electron Devices Meeting (IEDM), Dec. 9-11, 2013, pp. 3.7.1-3.7.4.

* cited by examiner

*Primary Examiner* — Ly D Pham
(74) *Attorney, Agent, or Firm* — Kenta Suzue; Haynes Beffel & Wolfeld LLP

(57) ABSTRACT

A semiconductor device includes active strips. Active strip stack selection structures electrically couple to the active strip stacks at positions between the first and second ends, and select particular ones of the active strip stacks for operations. In one embodiment, different pads coupled to opposite pads have a higher voltage, depending on the memory cell selected for read. The same active strip stack selection structure can act as a pair of side gates for opposite sides of a first active strip stack, and as one side gate for each of the adjacent active strip stacks. Each active strip stack can have: a first structure from a first set acting as first and second side gates on a first side of word lines; and a second structure and a third structure from a second set respectively acting as third and fourth side gates on the second side of word lines.

6 Claims, 12 Drawing Sheets

READ BIAS 1

READ BIAS 1          FIG. 3

READ BIAS 2

PROGRAM BIAS  FIG. 5

SPLIT PAGE 3D MEMORY ARRAY

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

High density memory devices are being designed that comprise arrays of flash memory cells, or other types of memory cells. In some examples, the memory cells comprise thin film transistors which can be arranged in 3D architectures.

In one example, a 3D memory device includes a plurality of stacks of NAND strings of memory cells. The stacks include active strips separated by insulating material. The 3D memory device includes an array including a plurality of word line structures, a plurality of string select structures, and ground select lines, arranged orthogonally over the plurality of stacks. Memory cells including charge storage structures are formed at cross-points between side surfaces of the active strips in the plurality of stacks and the word lines structures. Array arrangement for array elements including string select structures can affect array efficiency, and/or on/off characteristics for the stacks of NAND strings of 3D memory devices.

One 3D memory device uses finger VG (vertical gates), and has relatively low array efficiency because it uses two sets of SSL gate structures, two horizontal ground select lines, and two sets of ground contacts. Another 3D memory device uses IDG (independent double gates), and has higher array efficiency because it uses one set of SSL gate structures instead of two, one horizontal ground select line instead of two, and one ground line instead of two sets of ground contacts. But the second 3D memory device exhibits relatively poor current on/off characteristics.

Related U.S. patent application Ser. No. 13/887,019 shows one approach, in which IDGs control conductivity at one end of the stacks of NAND strings of memory cells. In this approach, one independent gate is positioned in between each adjacent pair of stacks of NAND strings of memory cells. Because of this substantially one-to-one numerical correspondence between the number of independent gates and the number of stacks of NAND strings of memory cells, the pitch requirements on contacts of the independent gates are relatively strict.

Another approach is a "twisted" selection structure arrangement, in which adjacent selection structures are staggered along the lengths of the stacks of NAND strings of memory cells at the same end of the stacks. Although such an arrangement has relatively relaxed pitch requirements on the contacts of the "twisted" selection structures, the staggering requires more space along the lengths of the stacks of NAND strings of memory cells.

It is desirable to provide a structure for three-dimensional integrated circuit memory with higher array efficiency, and improved on/off characteristics for the stacks of NAND strings.

SUMMARY

One aspect of the technology is an integrated circuit with a memory array, comprising: a plurality of active strip stacks with memory cells of the memory array, a plurality of active strip stack selection structures, and control circuitry.

The active strip stacks have first ends and second ends. A first pad is in contact with the first ends of one or more of the active strip stacks. A second pad is in contact with the second ends of one or more of the active strip stacks.

The active strip stack selection structures are electrically coupled to the active strip stacks at positions between the first ends and the second ends.

The control circuitry is coupled to the first pad and the second pad. The control circuitry is responsive to receiving a first command to read a first set of the memory cells on the memory array, by applying a first set of read voltages to the first pad and the second pad, such that the first pad has a higher voltage than the second pad. The control circuitry is responsive to receiving a second command to read a second set of the memory cells on the memory array, by applying a second set of read voltages to the first pad and the second pad, such that the second pad has a higher voltage than the first pad. Accordingly, whether the first pad or the second pad has the higher read voltage, depends of whether the memory cell(s) undergoing read are in the first set or second set of memory cells.

In one embodiment of the technology, the first set of voltages includes a bit line voltage applied to the first pad and a source line voltage applied to the second pad. The second set of voltages includes the bit line voltage applied to the second pad and the source line voltage applied to the first pad. Accordingly, the source line voltage and the bit line voltage are applied to different pads depending on whether the memory cell(s) undergoing read are in the first set or second set of memory cells.

In one embodiment of the technology, the active strip stack selection structures include: a first set of active strip stack selection structures on a first side of a plurality of word lines; and a second set of active strip stack selection structures on a second side of a plurality of word lines. The active strip stack selection structures select particular ones of the active strip stacks for operations, such as read, erase, and program.

In one embodiment of the technology, the first set of voltages includes a string select line voltage applied to at least one of the first set of active strip stack selection structures, and a ground select line voltage applied to at least one of the second set of active strip stack selection structures, and the second set of voltages includes the string select line voltage applied to at least one of the second set of active strip stack selection structures, and the ground select line voltage applied to at least one of the first set of active strip stack selection structures. Accordingly, the string select line voltage and the ground select line voltage are applied to different active strip stack selection structures depending on whether the memory cell(s) undergoing read are in the first set or second set of memory cells.

One embodiment of the technology includes a first plurality of metal lines carrying one of (i) a plurality of string select line signals and (ii) a plurality of ground select line signals, to the first set of active strip stack selection structures; and a second plurality of metal lines carrying the other one of (i) the plurality of string select line signals and (ii) the plurality of ground select line signals, to the second set of active strip stack selection structures. The first plurality of metal lines and the second plurality of metal lines are at a same metal layer.

In one embodiment of the technology, the plurality of active strip stacks include a first set of active strip stacks and a second set of active strip stacks interleaved with each other. The first set of active strip stacks are electrically coupled to the first pad and electrically decoupled from the second pad. The second set of active strip stacks are electrically coupled to the second pad and electrically decoupled from the first pad.

Another aspect of the technology is an integrated circuit with a memory array, comprising: a plurality of active strip stacks with memory cells of the memory array, and a plurality of active strip stack selection structures.

The active strip stack selection structures are electrically coupled to the active strip stacks at positions between the first ends and the second ends. The active strip stack selection structures select particular ones of the active strip stacks for operations, such as read, erase, and program. The active strip stack selection structures are double gate structures, and include a first set of active strip stack selection structures on a first side of a plurality of word lines, and a second set of active strip stack selection structures on a second side of the plurality of word lines.

Each active strip stack of the plurality of active strip stacks has: (i) a first active strip stack selection structure from the first set of active strip stack selection structures acting as first and second side gates on said each active strip stack on the first side of the plurality of word lines, and (ii) a second active strip stack selection structure and a third active strip stack selection structure from the second set of active strip stack selection structures respectively acting as third and fourth side gates on said each active strip stack on the second side of the plurality of word lines.

In some embodiments of the technology, adjacent active strip stacks have opposite orientations. A first one of the adjacent active strip stacks has a single stack selection structure-to-multiple stack selection structure orientation in a direction from the first ends to the second ends. A second one of the adjacent active strip stacks has a multiple stack selection structure-to-single stack selection structure orientation in the direction from the first ends to the second ends of the plurality of active strip stacks.

In one embodiment of the technology, the first one of the adjacent active strip stacks has the single stack selection structure-to-multiple stack selection structure orientation. The plurality of active strip stack selection structures apply multiple independently controlled voltages to the first one of the adjacent active strip stacks on a second side of a plurality of word lines. The second one of the adjacent active strip stacks has the multiple stack selection structure-to-single stack selection structure orientation. The plurality of active strip stack selection structures apply multiple independently controlled voltages to the second one of the adjacent active strip stacks on a first side of a plurality of word lines.

In one embodiment of the technology, the first one of the adjacent active strip stacks has the single stack selection structure-to-multiple stack selection structure orientation. The plurality of active strip stack selection structures apply only one independently controlled voltage to the first one of the adjacent active strip stacks on a first side of a plurality of word lines. The second one of the adjacent active strip stacks has a multiple stack selection structure-to-single stack selection structure orientation, such that the plurality of active strip stack selection structures apply only one independently controlled voltage to the second one of the adjacent active strip stacks on a second side of a plurality of word lines.

In one embodiment of the technology, the first one of the adjacent active strip stacks has the single stack selection structure-to-multiple stack selection structure orientation, such that only a first stack selection structure of the plurality of active strip stack selection structures is electrically coupled to the first one of the adjacent active strip stacks on a first side of a plurality of word lines, and a first set of multiple stack selection structures of the plurality of active strip stack selection structures are electrically coupled to the first one of the adjacent active strip stacks on a second side of a plurality of word lines. The second one of the adjacent active strip stacks has a multiple stack selection structure-to-single stack selection structure orientation, such that a second set of multiple stack selection structures of the plurality of active strip stack selection structures are electrically coupled to the second one of the adjacent active strip stacks on a first side of a plurality of word lines, and only a second stack selection structure of the plurality of active strip stack selection structures is electrically coupled to the second one of the adjacent active strip stacks on a second side of a plurality of word lines.

In one embodiment of the technology, the plurality of active strip stacks have first surfaces and second surfaces on opposite sides along the lengths of the active strip stacks. The multiple independently controlled voltages are applied to the first one of the adjacent active strip stacks on a second side of a plurality of word lines. The multiple independently controlled voltages include a first independently controlled voltage coupled to the first surface and not the second surface of the first one of the adjacent active strip stacks, and a second independently controlled voltage coupled to the second surface and not the first surface of the first one of the adjacent active strip stacks. In another embodiment, the multiple independently controlled voltages are applied to the second one of the adjacent active strip stacks on a first side of a plurality of word lines. The multiple independently controlled voltages includes a third independently controlled voltage coupled to the first surface and not the second surface of the second one of the adjacent active strip stacks, and a fourth independently controlled voltage coupled to the second surface and not the first surface of the second one of the adjacent active strip stacks.

Yet another aspect of the technology is an integrated circuit with a memory array, comprising: a plurality of active strip stacks with memory cells of the memory array, and a plurality of active strip stack selection structures.

The active strip stacks have first ends and second ends.

The active strip stack selection structures are electrically coupled to the active strip stacks at positions between the first ends and the second ends. The active strip stack selection structures select particular ones of the active strip stacks for operations, such as read, erase, and program.

The active strip stack selection structures are positioned to surround alternating ends of the plurality of active strip stacks. With adjacent active strip stacks, (i) a first one of the adjacent active strip stacks has a first active strip stack selection structure positioned to surround the first one of the adjacent active strip stacks on a first side of a plurality of word lines, and (ii) a second one of the adjacent active strip stacks has a second active strip stack selection structure positioned to surround the second one of the adjacent active strip stacks on a second side of a plurality of word lines.

In one embodiment of the technology, the first end of the first one of the adjacent active strip stacks receives, via the first active strip stack selection structure, a first independently controlled voltage from the plurality of active strip stack selection structures. The first active strip stack selection structure provides the first independently controlled voltage on a second side of a plurality of word lines to active strip stacks of the plurality of active strip stacks adjacent to either side of the first one of the adjacent active strip stacks. The second end of the second one of the adjacent active strip stacks receives, via the second active strip stack selection structure, a second independently controlled voltage from the plurality of active strip stack selection structures. The second active strip stack selection structure provides the second independently controlled voltage on a first side of a plurality of word lines to active strip stacks of the plurality of active strip stacks adjacent to either side of the second one of the adjacent active strip stacks.

A further aspect of the technology is an integrated circuit with a memory array, comprising: a plurality of active strip stacks with memory cells of the memory array, and a plurality of active strip stack selection structures.

The active strip stacks have a stack width, and first ends and second ends. Adjacent ones of the active strip stacks are positioned apart by a gap width.

The active strip stack selection structures are electrically coupled to the active strip stacks at positions between the first ends and the second ends. The active strip stack selection structures select particular ones of the active strip stacks for operations, such as read, erase, and program. The active strip stack selection structures have a structure width greater than a sum of: (i) the stack width and (ii) twice the gap width, and less than a sum of: (i) twice the stack width and (ii) twice the gap width.

In one embodiment of the technology, the active strip stack selection structures are configured to act as side gates for channels in the plurality of active strip stacks, thereby forming string select switches.

One aspect of the technology is a method of operating an integrated circuit with a memory array, comprising:

applying a first control voltage to a first active strip stack selection structure arranged as: (i) first and second side gates for opposite sides of a first active strip stack, the first active strip stack in between a second active strip stack and a third active strip stack, (ii) a first side gate but not a second side gate of the second active strip stack, and (iii) a first side gate but not a second side gate of a third active strip stack.

In one embodiment of the technology, the first active strip stack has first and second ends, and the first control voltage is applied by the first active strip stack selection structure to the first active strip stack on a first side of a plurality of word lines, and the method further comprises:

applying a second control voltage to a second active strip stack selection structure arranged as a first side gate but not a second side gate on a second side of a plurality of word lines.

In one embodiment of the technology, the method further comprises, applying a third control voltage to a third active strip stack selection structure arranged as a second side gate but not a first side gate on a second side of a plurality of word lines.

Other aspects and advantages of the present invention can be seen on review of the drawings, the detailed description and the claims, which follow.

DETAILED DESCRIPTION

A detailed description of embodiments is provided with reference to the Figures.

Figure 1:
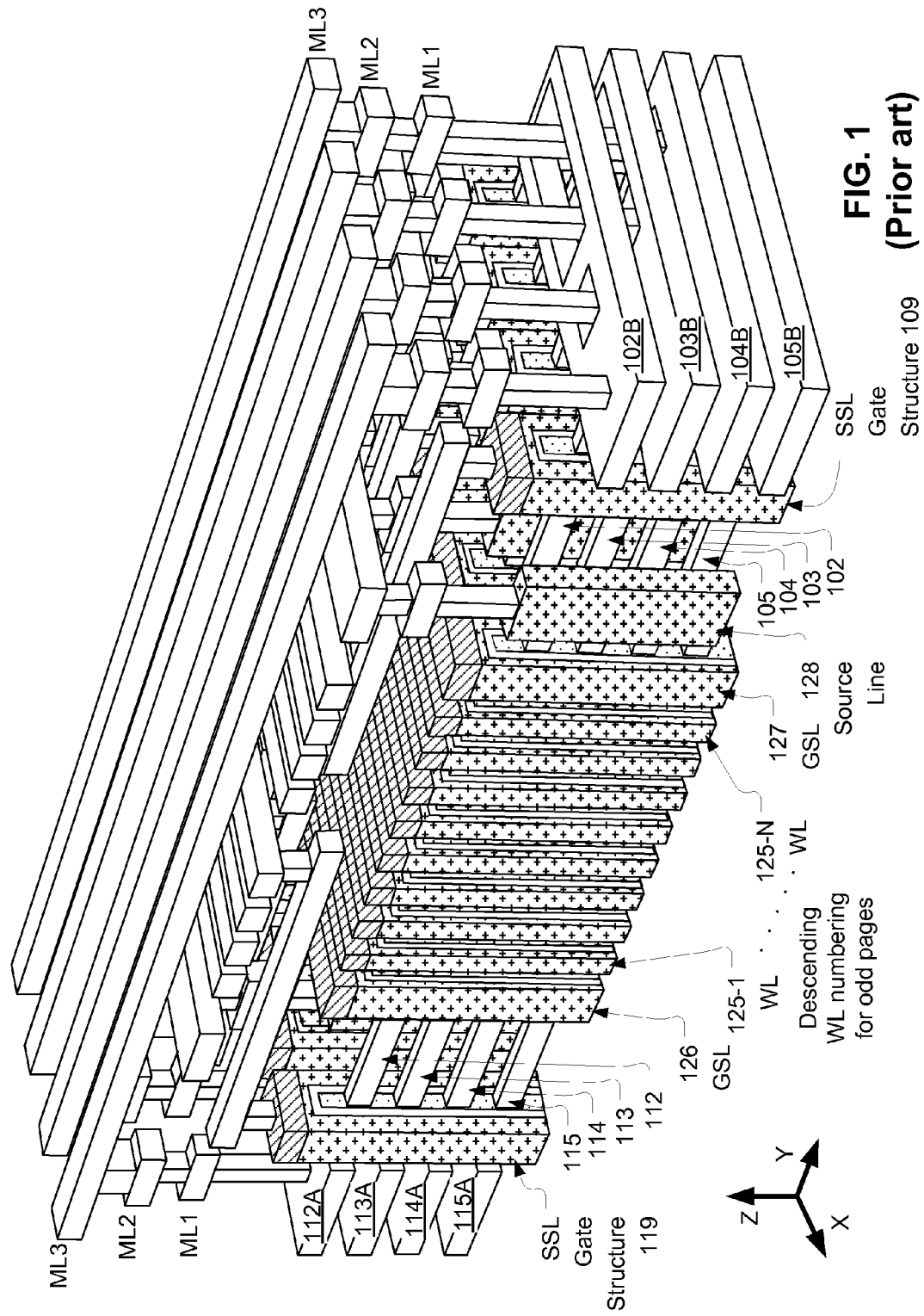
FIG. 1 is a perspective illustration of a 3D NAND memory array structure.

FIG. 1 is a perspective illustration of a 3D NAND memory array structure. Insulating material is removed from the drawing to expose additional structure for illustrative purposes. For example, insulating layers are removed between the active strips (e.g. 112-115) in stacks, and are removed between the stacks of active strips.

The multilayer array is formed on an insulating layer, and includes a plurality of word lines 125-1 WL, . . . , 125-N WL conformal with the plurality of stacks. The plurality of stacks includes active strips 112, 113, 114, 115. Example materials of active strips include doped semiconductor and metal. Active strips in the same plane are electrically coupled together by a pad arranged to have a landing area for contact to an interlayer conductor. The pads for a plurality of layers can be arranged in stairstep structures as shown in FIG. 1, with the landing area on each successive pad disposed on a step of the structure. Landing areas for connection of the pads and the interlayer conductors to the landing areas on the pads can be arranged in patterns other than a simple stairstep, if desired or needed for a particular manufacturing setting.

The shown word line numbering, ascending from 1 to N going from the back to the front of the overall structure, applies to even memory pages. For odd memory pages, the word line numbering descends from N to 1 going from the back to the front of the overall structure.

Pads 112A, 113A, 114A, 115A terminate alternate active strips, such as active strips 112, 113, 114, 115 in each layer. As illustrated, these pads 112A, 113A, 114A, 115A are electrically connected to different bit lines for connection to decoding circuitry to selected planes within the array. These pads 112A, 113A, 114A, 115A can be patterned, with the possible exception of vias to the landing areas, at the same time that the plurality of stacks are defined.

Pads 102B, 103B, 104B, 105B terminate the other alternate active strips, such as active strips 102, 103, 104, 105 in each layer. As illustrated, these pads 102B, 103B, 104B, 105B are electrically connected to different bit lines for connection to decoding circuitry to selected planes within the array. These pads 102B, 103B, 104B, 105B can be patterned, with possible the exception of vias to the landing areas, at the same time that the plurality of stacks are defined.

As shown, any given stack of active strips is coupled to either the pads 112A, 113A, 114A, 115A, or the pads 102B, 103B, 104B, 105B, but not both in the illustrated example. However, in the remaining figures directed to embodiments of the present technology, the stacks of active strips are coupled to pads on both ends of stacks of active strips.

A stack of active strips has one of the two opposite orientations of bit line end-to-source line end orientation, or source line end-to-bit line end orientation. For example, the stack of active strips 112, 113, 114, 115 has bit line end-to-source line end orientation; and the stack of active strips 102, 103, 104, 105 has source line end-to-bit line end orientation.

The stack of active strips 112, 113, 114, 115 is terminated at one end by the pads 112A, 113A, 114A, 115A, passes through SSL gate structure 119, ground select line GSL 126, word lines 125-1 WL through 125-N WL, ground select line GSL 127, and terminated at the other end by source line 128. The stack of active strips 112, 113, 114, 115 does not reach the pads 102B, 103B, 104B, 105B.

The stack of active strips 102, 103, 104, 105 is terminated at one end by the pads 102B, 103B, 104B, 105B, passes through SSL gate structure 109, ground select line GSL 127, word lines 125-N WL through 125-1 WL, ground select line GSL 126, and terminated at the other end by a source line (obscured by other parts of figure). The stack of active strips 102, 103, 104, 105 does not reach the pads 112A, 113A, 114A, 115A.

A layer of memory material separates the word lines 125-1 WL through 125-N WL, from the active strips 112-115 and 102-105. Ground select lines GSL 126 and GSL 127 are conformal with the plurality of active strips, similar to the word lines.

Every stack of active strips is terminated at one end by pads, and at the other end by a source line. For example, the stack of active strips 112, 113, 114, 115 is terminated at one end by pads 112A, 113A, 114A, 115A, and terminated on the other end by source line 128. At the near end of the figure, every other stack of active strips is terminated by the pads 102B, 103B, 104B, 105B; and every other stack of active strips is terminated by a separate source line. At the far end of the figure, every other stack of active strips is terminated by the pads 112A, 113A, 114A, 115A, and every other stack of active strips is terminated by a separate source line.

As previously mentioned, in the remaining figures directed to embodiments of the present technology, the stacks of active strips are coupled to pads on both ends of stacks of active strips.

Bit lines and string select lines are formed at the metals layers ML1, ML2, and ML3. Transistors are formed at cross points between the active strips (e.g. 112-115) and the word line 125-1 WL through 125-N WL. In the transistors, the active strip (e.g. 113) acts as the channel region of the device. The active strips (e.g. 112-115) can act as the gate dielectric for the transistors.

String select structures (e.g. 119, 109) are patterned during the same step that the word lines 125-1 WL through 125-n WL are defined. Transistors are formed at cross points between the active strips (e.g. 112-115) and the string select structures (e.g. 119, 109). These transistors act as string select switches coupled to decoding circuitry for selecting particular stacks in the array.

Figure 2:
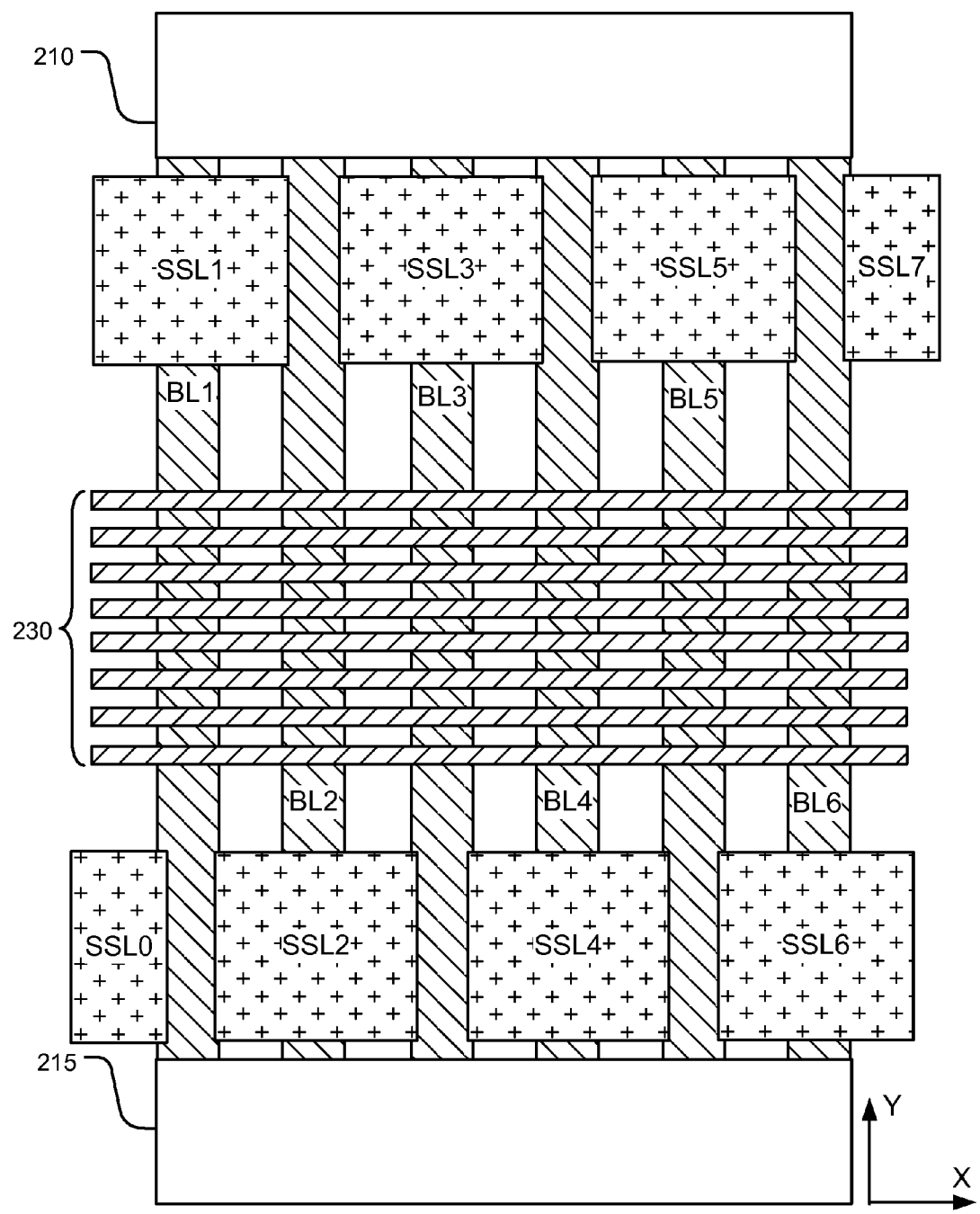
FIG. 2 is a layout view of a first array arrangement for a finger VG (vertical gate) 3D NAND memory device with a split page.

FIG. 2 is a layout view of a first array arrangement for a finger VG (vertical gate) 3D NAND memory device. For reference, the "X" axis lies in the horizontal direction parallel to the word lines (e.g. 125-1 WL through 125-N WL in FIG. 1 or 230 in FIG. 2) in the structure, the "Y" axis lies in the vertical direction parallel to the active strips (e.g. 112-115 in FIG. 1 or BL1-BL6 in FIG. 2) in the structure, and the "Z" axis lies is direction into and out of the page, orthogonal to the word lines and to the active strips in the structure.

In the layout view of FIG. 2, the array arrangement includes a plurality of active strips. The memory cells are disposed at cross-points of active strips (e.g. BL1-BL6) and word lines (e.g. 230). Adjacent active strips alternate between opposite orientations, of single string select structure-to-multiple string select structure orientation, and multiple string select structure-to-single string select structure orientation. In one orientation of the active strips, every other active strip (e.g., BL1, BL3, BL5) runs through a single string select structure (e.g., SSL1, SSL3, SSL5) proximate to the pad at the top (e.g. 210) and between two string select structures (e.g., SSL0 and SSL2, SSL2 and SSL4, SSL4 and SSL6) proximate to the pad at the bottom (e.g. 215).

In the opposite orientation of the active strips, every other active strip (e.g., BL2, BL4, BL6) runs between two string select structures (e.g., SSL1 and SSL3, SSL3 and SSL5, SSL5 and SSL7) proximate to the pad at the top (e.g. 210) and through a single string select structure (e.g., SSL2, SSL4, SSL6) proximate to the pad at the bottom (e.g. 215).

Accordingly, an active strip that is surrounded by a string select structure strip proximate to the top end of the active strips runs between two string select structures proximate to the bottom end of the active strips. For example, active strip BL1 runs through SSL1 proximate to pad 210 and between SSL0 and SSL2 proximate to pad 215.

Similarly, an active strip that runs between two string select structures proximate to the top end of the active strips is surrounded by a string select structure strip proximate to the bottom end of the active strips. For example, active strip BL2 run between SSL1 and SSL3 proximate to pad 210 and through SSL2 proximate to pad 215.

Overlying the active strips (e.g. BL1-BL6), are the horizontal word lines (e.g. 230) and the string select line SSL gate structures. Proximate to upper pad 210, the string select structures (e.g. SSL1, SSL3, SSL5) surround every other active strip proximate to the top end of the active strips (e.g. BL1, BL3, BL5), acting as a pair of side gates on both side surfaces of the respective active strips. SSL1 acts as a pair of side gates for BL1. SSL3 acts as a pair of side gates for BL3. SSL5 acts as a pair of side gates for BL5. Proximate to bottom pad 215, the string select structures (e.g. SSL2, SSL4, SSL6) surround every other active strip proximate to the bottom end of the active strips (e.g. BL2, BL4, BL6), acting as side gates on both side surfaces of the respective active strip. SSL2 acts as a pair of side gates for BL2. SSL4 acts as a pair of side gates for BL4. SSL6 acts as a pair of side gates for BL6.

Proximate to upper pad 210, the string select structures (e.g. SSL1, SSL3, SSL5) which surround every other active strip proximate to the top end of the active strips (e.g. BL1, BL3, BL5), also act as a side gate on one side surface for each of the adjacent active strips. SSL1 acts as one side gate for BL2. SSL3 acts as one side gate for BL2, and one side gate for BL4. SSL5 acts as one side gate for BL4, and one side gate for BL6. Also, SSL7 acts as one side gate for BL6.

Proximate to bottom pad 215, the string select structures (e.g. SSL2, SSL4, SSL6) which surround every other active strip proximate to the bottom end of the active strips (e.g. BL2, BL4, BL6), also act as a side gate on one side surface for each of the adjacent active strips. SSL2 acts as one side gate for BL1, and one side gate for BL3. SSL4 acts as one side gate for BL3, and one side gate for BL5. SSL6 acts as one side gate for BL5. Also, SSL0 acts as one side gate for active strip BL1.

The horizontal word lines (e.g. 230) are interleaved with insulation material (not shown). There can be 64 word lines disposed between the top and bottom string select line structures (e.g. between SSL1, SSL3, SSL5, SSL7 on top and SSL0, SSL2, SSL4, SSL6 on bottom). The word lines can be manufactured with SADP (self-aligned double patterning).

The 3D NAND memory device includes a plurality of planes of memory cells. A plurality of bit lines from an upper metal layer selects a particular plane in the plurality of planes of memory cells via pads (e.g. 210, 215 in FIG. 2). The particular memory cell within a particular plane is decoded by a plurality of string select line structures and word lines.

Figure 3:
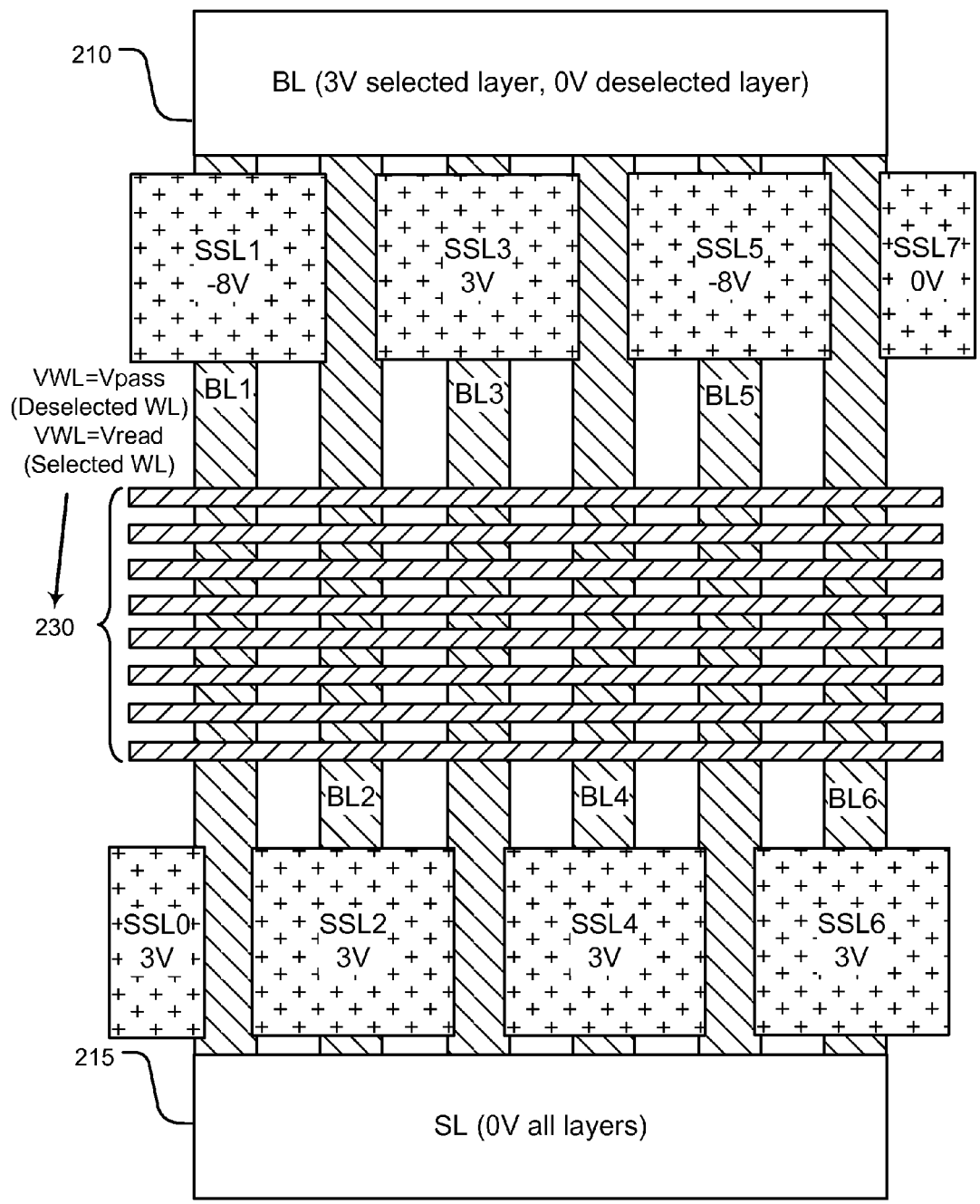
FIG. 3 is a layout view of a first array arrangement for a finger VG (vertical gate) 3D NAND memory device, as shown in FIG. 2, with a read bias arrangement.

FIG. 3 is a layout view of a first array arrangement for a finger VG (vertical gate) 3D NAND memory device, as shown in FIG. 2, with a read bias arrangement.

The memory cell selected for read is in the active strip stack BL3. To select BL3, the top and bottom parts of BL3 are turned on. The string select line SSL structure SSL3 which surrounds BL3 and acts as a pair of side gates to BL3 by the top pad 210 has a select voltage 3V, turning on the top part of BL3. The string select line SSL structures SSL2 and SSL4 which are adjacent to BL3 and acts as a pair of side gates to BL3 by the bottom pad 215 have a select voltage 3V, turning on the bottom part of BL3.

Adjacent to the selected active strip BL3 are deselected active strips BL2 and BL4. Both BL2 and BL4 are surrounded by SSL2 and SSL4 respectively by the bottom pad 215 each acting as a pair of side gates with a select voltage of 3V, turning on the bottom parts of BL2 and BL4. However, both BL2 and BL4 have respective side gates SSL1 and SSL5 by the top pad 210, with a strong negative voltage −8V. The strong negative voltage on one side gate overcomes the select voltage 3V from the other side gate SSL3, turning off the top parts of BL2 and BL4. Because both the top and bottom parts of an active strip are turned on for a selected active strip, and the top part remains off for BL2 and BL4, BL2 and BL4 remain deselected. Gates SSL0, SSL2, SSL4, SSL6 have 3V.

The top pad 210 has a bit line voltage 3V for the selected layer of the memory array and 0V for the deselected layers of the memory array, and the bottom pad 215 has a source line voltage 0V for all layers. Deselected ones of the word lines 230 have a pass voltage, and the selected one of the word lines 230 has a read voltage. At the selected layer according to the top pad 210, a read current flows from the top pad 210 towards the bottom pad 215, through the selected active strip BL3. The value or existence of the current depends on the threshold voltage of the memory cell selected by the selected word line.

Figure 4:
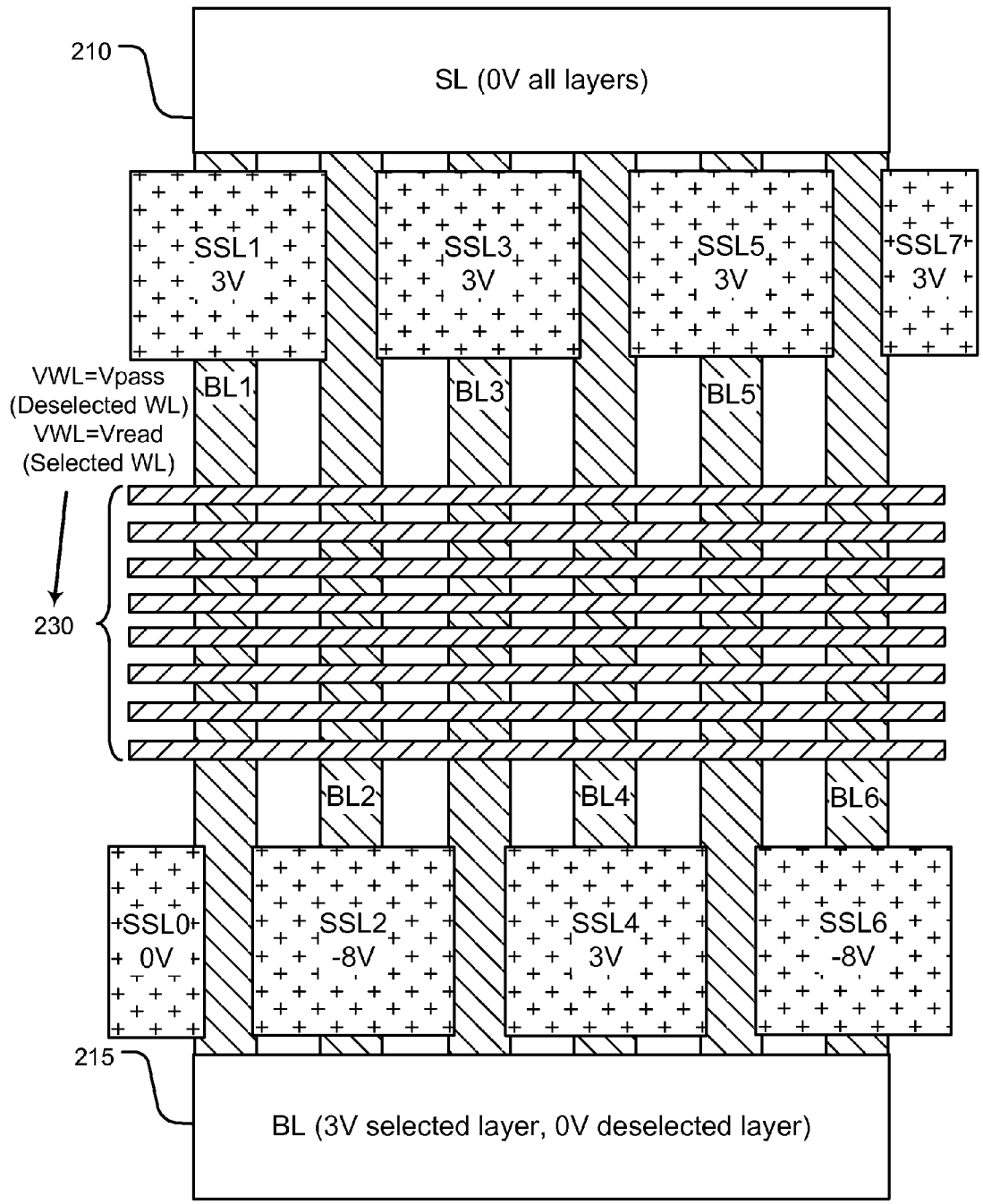
FIG. 4 is a layout view of a first array arrangement for a finger VG (vertical gate) 3D NAND memory device, as shown in FIG. 2, with another read bias arrangement.

FIG. 4 is a layout view of a first array arrangement for a finger VG (vertical gate) 3D NAND memory device, as shown in FIG. 2, with another read bias arrangement.

The memory cell selected for read is in the active strip stack BL4. To select BL4, the top and bottom parts of BL4 are turned on. The string select line SSL structure SSL4 which surrounds BL4 and acts as a pair of side gates to BL4 by bottom top pad 215 has a select voltage 3V, turning on the bottom part of BL4. The string select line SSL structures SSL3 and SSL5 which are adjacent to BL4 and acts as a pair of side gates to BL4 by the top pad 210 have a select voltage 3V, turning on the top part of BL4.

Adjacent to the selected active strip BL4 are deselected active strips BL3 and BL5. Both BL3 and BL5 are surrounded by SSL3 and SSL5 respectively by the top pad 210 each acting as a pair of side gates with a select voltage of 3V, turning on the top parts of BL3 and BL5. However, both BL3 and BL5 have respective side gates SSL2 and SSL4 by the bottom pad 215, with a strong negative voltage −8V. The strong negative voltage on one side gate overcomes the select voltage 3V from the other side gate SSL4, turning off the bottom parts of BL3 and BL5. Because both the top and bottom parts of an active strip are turned on for a selected active strip, and the bottom part remains off for BL3 and BL5, BL3 and BL5 remain deselected. Gates SSL1, SSL3, SSL5, SSL7 have 3V.

The bottom pad 215 has a bit line voltage 3V for the selected layer of the memory array and 0V for the deselected layers of the memory array, and the top pad 210 has a source line voltage 0V for all layers. Deselected ones of the word lines 230 have a pass voltage, and the selected one of the word lines 230 has a read voltage. At the selected layer according to the bottom pad 215, a read current flows from the bottom pad 215 towards the top pad 210, through the selected active strip BL4. The value or existence of the current depends on the threshold voltage of the memory cell selected by the selected word line.

FIGS. 3 and 4 show that whether the top pad 210 and the bottom pad 215 provide the bit line voltage and the source line voltage respectively, or the source line voltage and the bit line voltage respectively, depending on the particular active strip that is selected which contains the memory cell selected for read. Similarly, whether the string select structures SSL1, SSL3, SSL5, and SSL7 proximate to the top pad 210; and the string select structures SSL0, SSL2, SSL4, and SSL6 proximate to the bottom pad 215 respectively provide the string select line voltage and the ground select line voltage, or respectively provide the ground select line voltage and the string select line voltage, depends on the particular active strip that is selected which contains the memory cell selected for read. Other voltages can be used for the select, deselect, inhibit, and read voltages.

Figure 5:
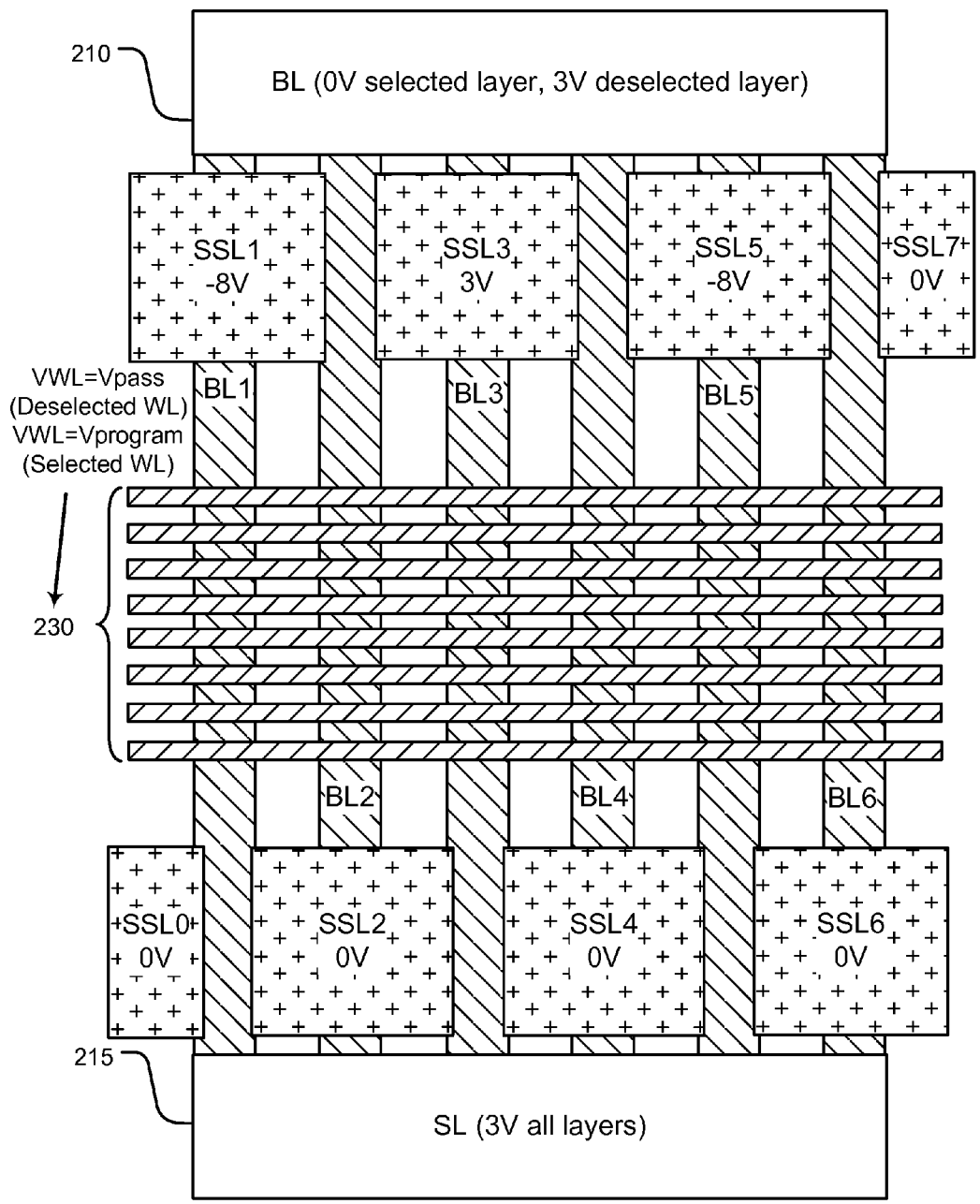
FIG. 5 is a layout view of a first array arrangement for a finger VG (vertical gate) 3D NAND memory device, as shown in FIG. 2, with a program bias arrangement.

FIG. 5 is a layout view of a first array arrangement for a finger VG (vertical gate) 3D NAND memory device, as shown in FIG. 2, with a program bias arrangement.

The memory cell selected for program is in the active strip stack BL3. To select BL3, the string select line SSL structure SSL3 which surrounds BL3 and acts as a pair of side gates to BL3 by the top pad 210 has a select voltage 3V, turning on the BL3. Adjacent to the selected active strip BL3 are deselected active strips BL2 and BL4, which each have a side surface receiving a select voltage 3V from BL3 acting as a side gate. Both BL2 and BL4 have respective side gates SSL1 and SSL5 by the top pad 210, with a strong negative voltage −8V. The strong negative voltage on one side gate overcomes the select voltage 3V from the other side gate SSL3, turning off BL2 and BL4.

The top pad 210 has a bit line voltage 0V for the selected layer of the memory array and 3V for the deselected layers of the memory array, and the bottom pad 215 has a source line voltage 3V for all layers. Deselected ones of the word lines 230 have a pass voltage, and the selected one of the word lines 230 has a program voltage. At the selected layer according to the top pad 210, a program current flows through the selected active strip BL3 from the top pad 210 in a direction towards the bottom pad 215, and then are injected into the memory cell selected by the selected word line. Other voltages can be used for the select, deselect, inhibit, and program voltages.

Figure 6:
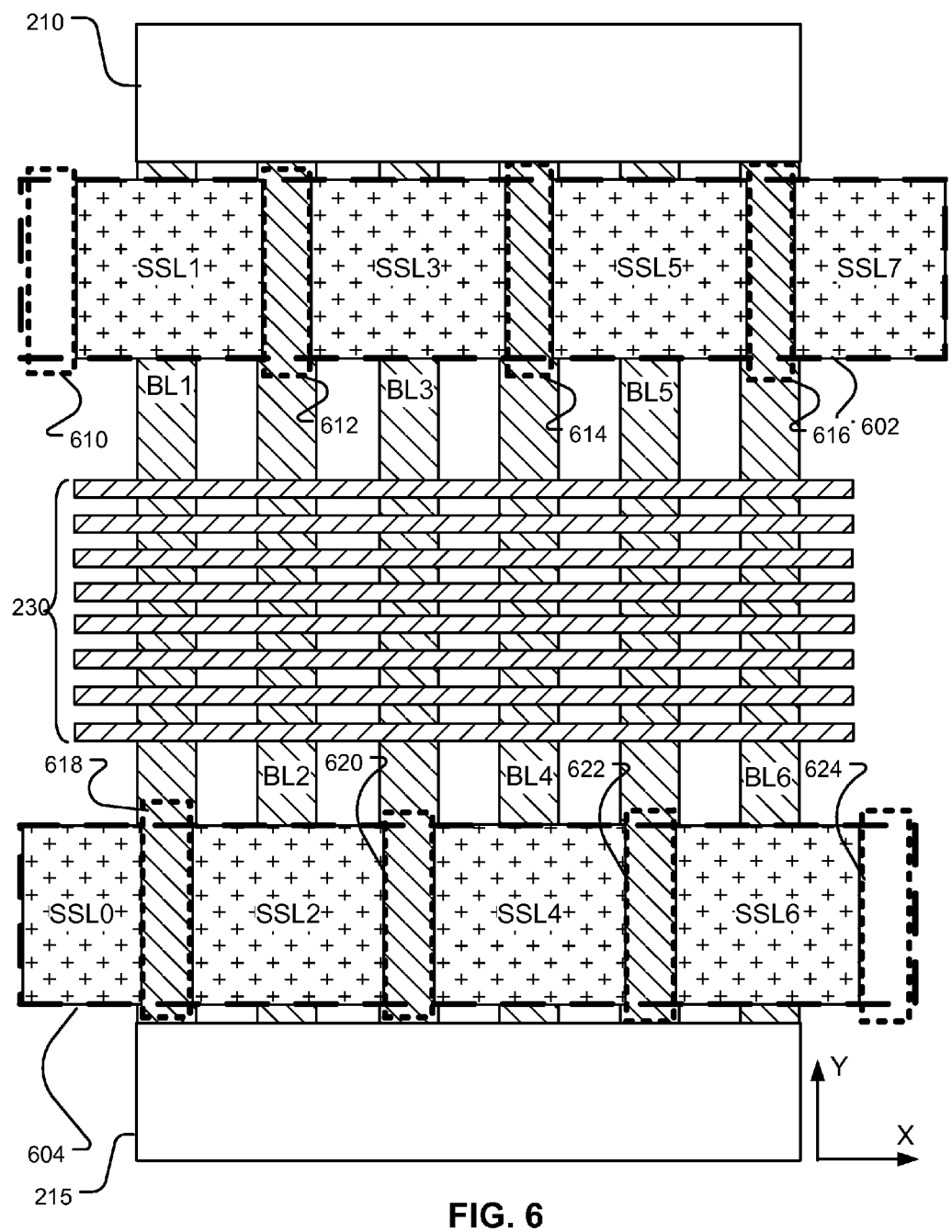
FIG. 6 is a layout view of a first array arrangement for a finger VG (vertical gate) 3D NAND memory device, as shown in FIG. 2, with a superimposed outline of masks for the string select line SSL structures.

FIG. 6 is a layout view of a first array arrangement for a finger VG (vertical gate) 3D NAND memory device, as shown in FIG. 2, with a superimposed outline of masks for the string select line SSL structures.

The first mask with outlines 602 and 604 show the example respective patterns for defining the block of string select line structures SSL1, SSL3, SSL5, and SSL7 by the top pad 210; and the block of string select line structures SSL0, SSL2, SSL4, and SSL6 by the bottom pad 215.

The second mask with outlines 610, 612, 614, 616 shows the example patterns for etching apart the block of string select line structures SSL1, SSL3, SSL5, and SSL7 by the top pad 210. The second mask also has outlines 618, 620, 622, 624 showing the example patterns for etching apart the block of string select line structures SSL0, SSL2, SSL4, and SSL6 by the bottom pad 215.

Figure 7:
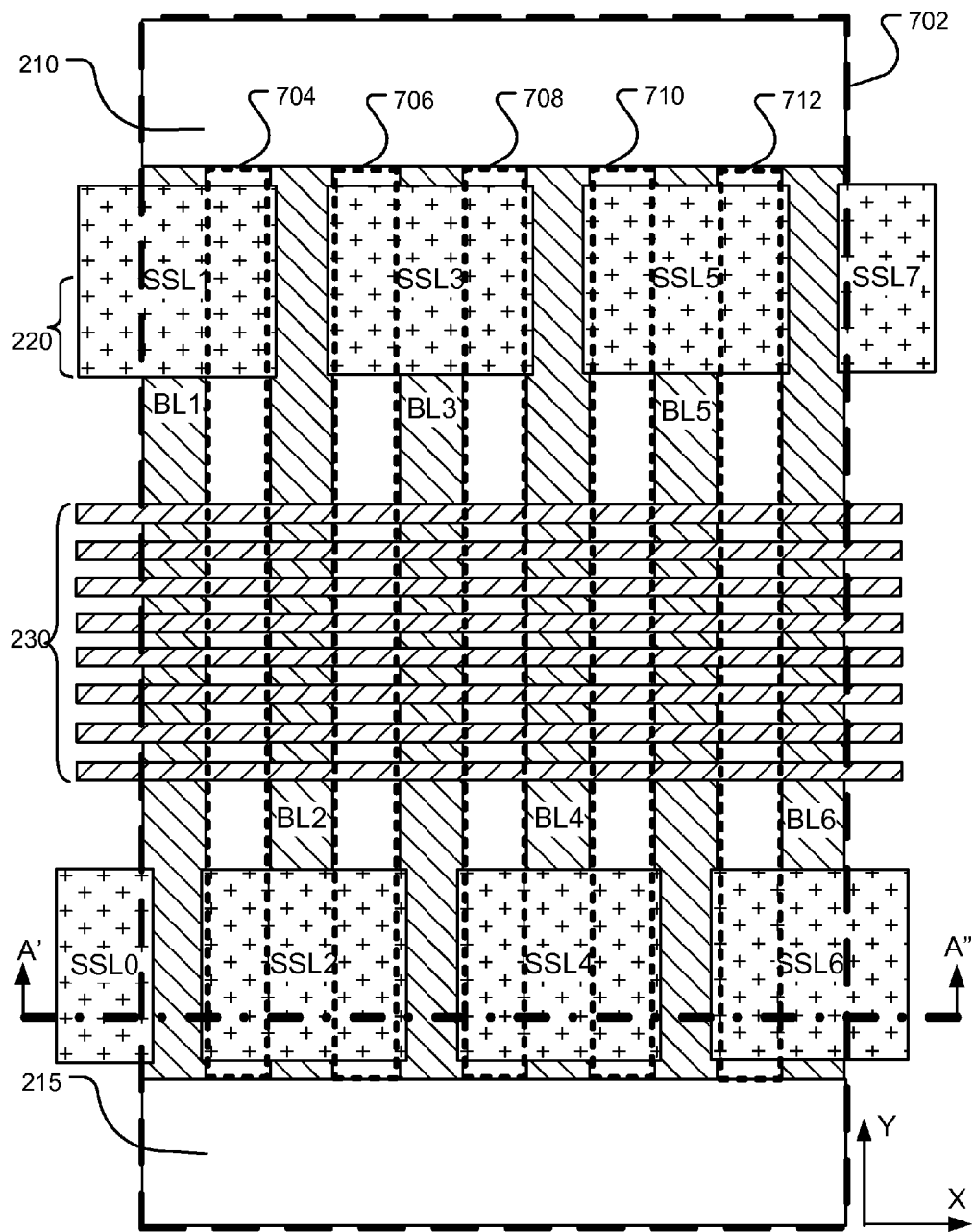
FIG. 7 is a layout view of a first array arrangement for a finger VG (vertical gate) 3D NAND memory device, as shown in FIG. 2, with a superimposed outline of masks for the pads and the active strip stacks.

FIG. 7 is a layout view of a first array arrangement for a finger VG (vertical gate) 3D NAND memory device, as shown in FIG. 2, with a superimposed outline of masks for the pads and the active strip stacks.

The mask with outline 702 shows an example pattern for defining the overall area with the top pad 210, bottom pad 215, and active strip stacks BL1-BL6. The same mask includes an example pattern with outlines 704, 706, 708, 710, and 712 for defining the gaps between the active strip stacks. The gaps define a gap width in the X direction separating adjacent ones of the active strip stacks. The active strip stacks have a stack width in the X direction.

Cross-section line A'-A" indicates the location of the cross-sectional view of subsequent figures.

Figure 8:
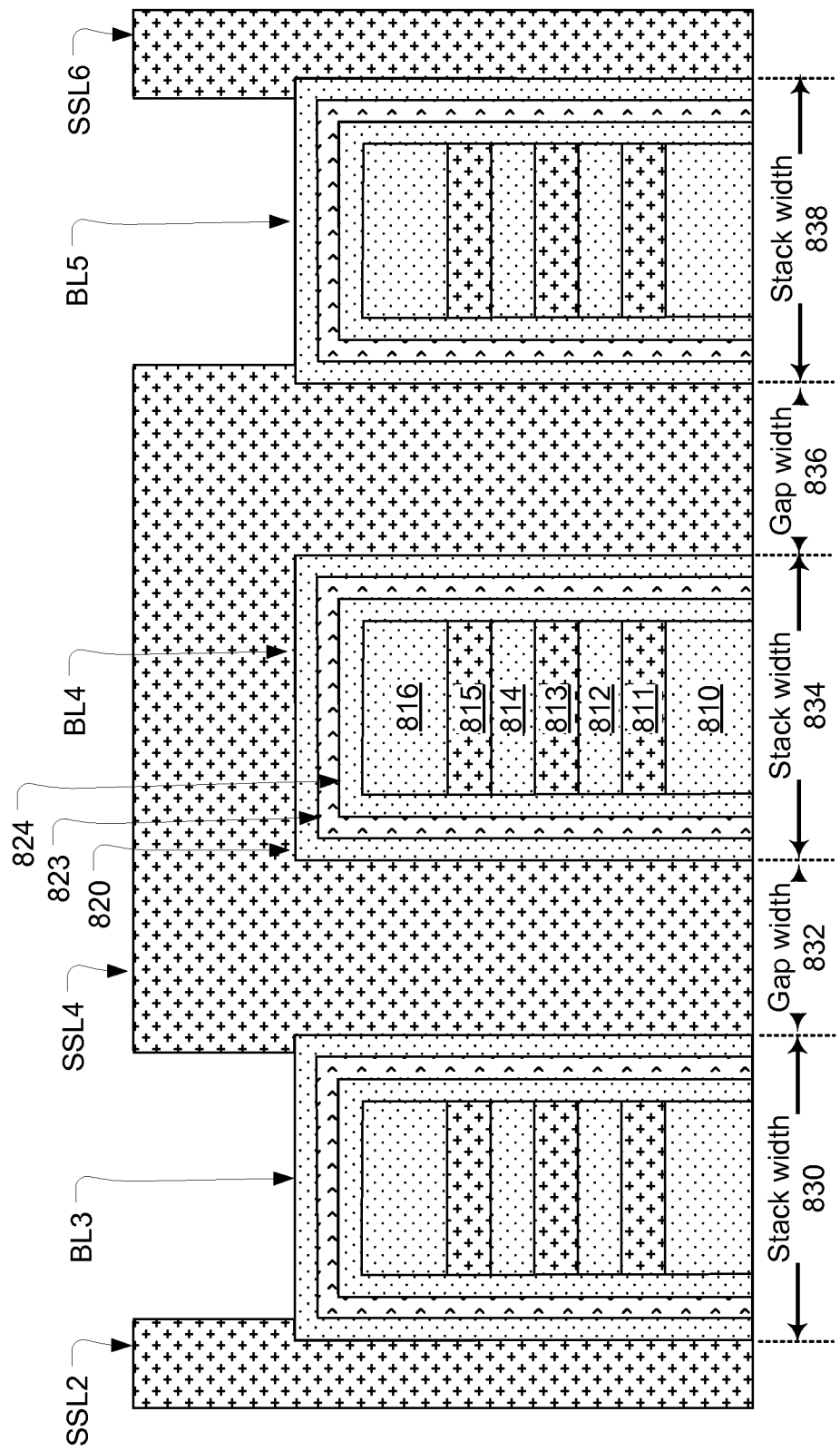
FIG. 8 is a cross-sectional view of a first array arrangement for a finger VG (vertical gate) 3D NAND memory device, as shown in FIG. 2.

FIG. 8 is a cross-sectional view of a first array arrangement for a finger VG (vertical gate) 3D NAND memory device, as shown in FIG. 2.

The cross-sectional view in FIG. 8 is taken along the cross-section line A'-A" in FIG. 7. Oxide is removed for purposes of ease of illustration.

BL4 is an active strap stack with active strips 815, 813, and 811. The active strips are separated by insulating strips 816, 814, 812, and 810. The active strip stack includes a covering memory material layer, which can be a bandgap engineered SONOS (BE-SONOS) charge storage structure that includes a dielectric tunneling layer that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer in this embodiment comprises silicon dioxide on the side surface of the semiconductor material strips formed for example using in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 30 Å, and preferably 25 Å or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 35 Å, and preferably 25 Å or less. This three-layer tunneling layer results in an inverted U-shaped valence band energy level.

The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the composite tunneling dielectric after the first location. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

Adjacent active strips stacks BL3 and BL5 have similar construction as BL4.

String select line structure SSL4 surrounds the active strip stack BL4, acting as a pair of side gates for side surfaces of the active strips 815, 813, and 811. String select line structure SSL4 also acts as one side gate on one side surface of the active strips in BL3, and. String select line structure SSL4 also acts as one side gate on one side surface of the active strips in BL3.

The active strips stacks such as BL3, BL4, and BL4 have respective stack widths 830, 834, and 838. The active strip stacks are separated by gap widths, such as gap width 832 between BL3 and BL4, and gap width 836 between BL4 and BL5. In order for the string select line structure SSL4 to be sufficiently wide to not only surround active strip stack BL4 and acts as a pair of side gates for active strip stack BL4, but to also act as side gates for adjacent active strip stacks BL3 and BL5, the string select line structure SSL4 has a width exceeding a sum of: (i) the stack width and (ii) twice the gap width. However, to avoid touching adjacent string select line structures SSL2 and SSL4, the string select line structures SSL2, SSL4, and SSL6 have a width less than a sum of: (i) twice the stack width and (ii) twice the gap width.

Figure 9:
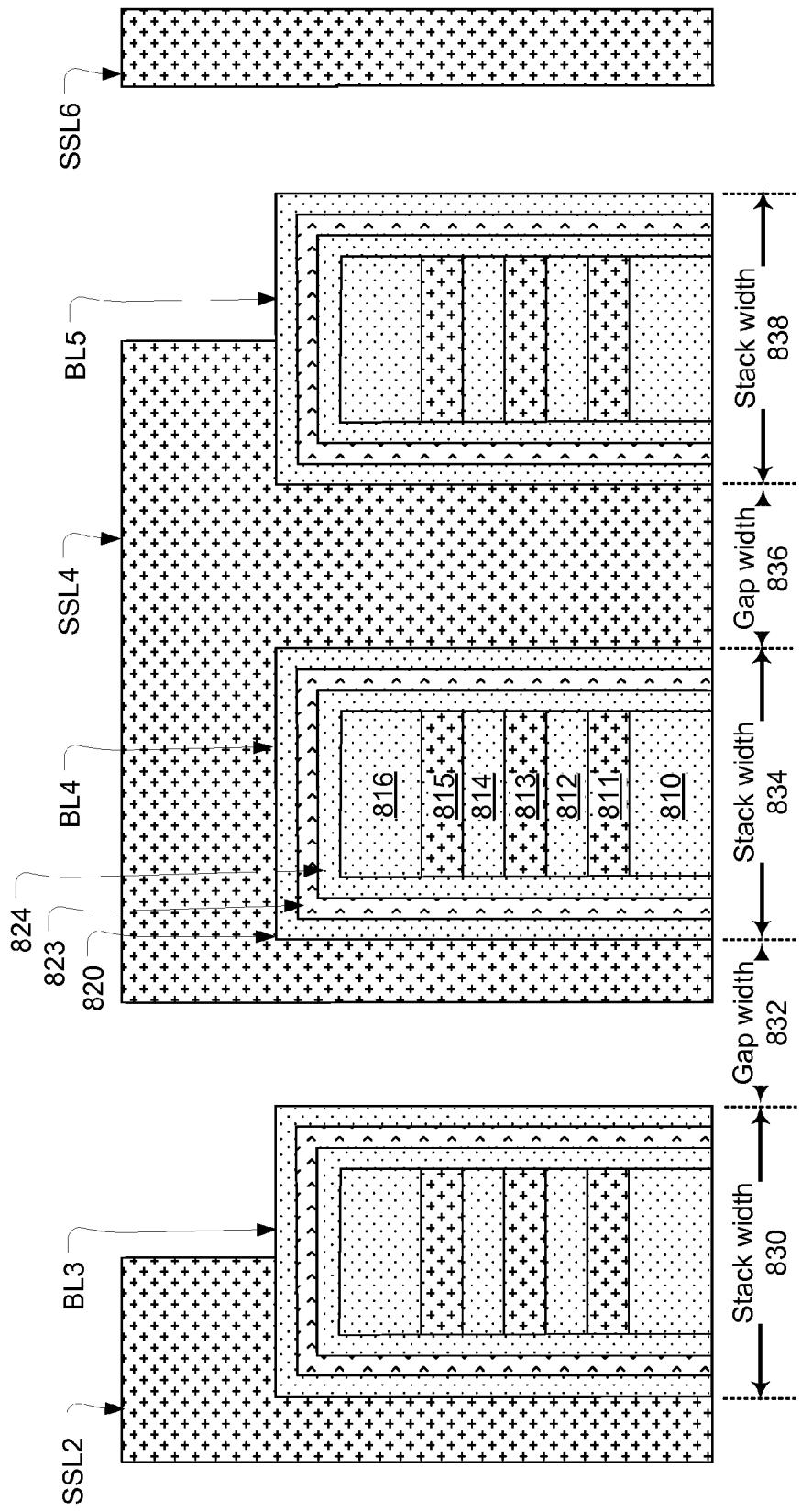
FIG. 9 is a cross-sectional view of a first array arrangement for a finger VG (vertical gate) 3D NAND memory device, as shown in FIG. 2, with a misaligned string select line structure.

FIG. 9 is a cross-sectional view of a first array arrangement for a finger VG (vertical gate) 3D NAND memory device, as shown in FIG. 2, with a misaligned string select line structure.

Unlike the cross-sectional view of FIG. 8, the string select line SSL structure SSL4 is off center relative to the active strip stack BL4. Despite the poor alignment of up to about the gap width 832/836, SSL4 still surrounds the active strip stack BL4, and acts as a pair of side gates for both side surfaces of the active strip stack BL4.

However, such misalignment is suboptimal, because the string select line SSL structure SSL4 acts as one side gate for one surface of BL5, but not for BL3. So misalignment can result in one end of the active strips stacks having only side gate, rather than two side gates.

Figure 10:
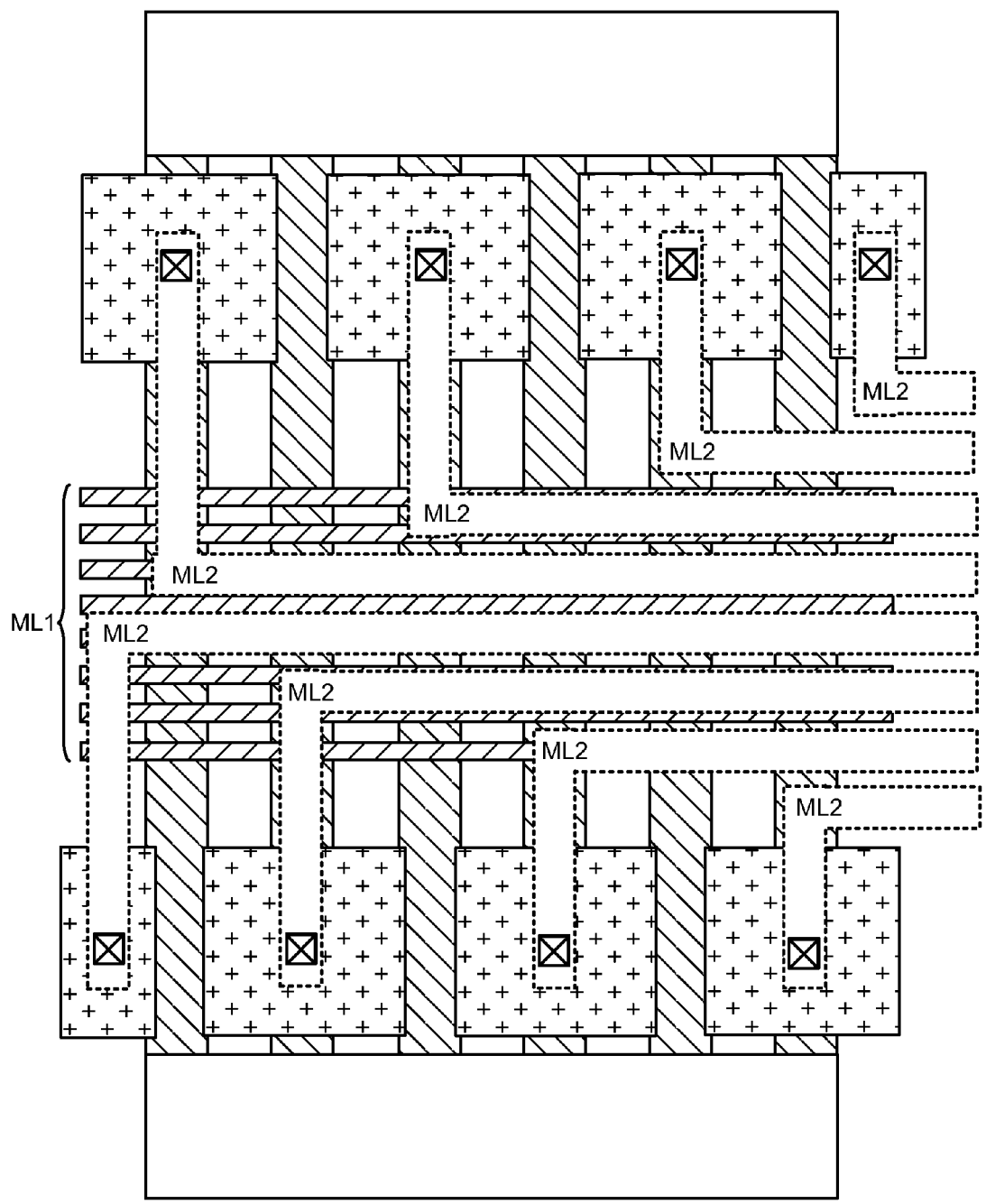
FIG. 10 is a layout view of a first array arrangement for a finger VG (vertical gate) 3D NAND memory device, as shown in FIG. 2, with a superimposed layer of metal lines that carry the string select line voltages.

FIG. 10 is a layout view of a first array arrangement for a finger VG (vertical gate) 3D NAND memory device, as shown in FIG. 2, with a superimposed layer of metal lines that carry the string select line voltages.

The layer of metal lines carries the string select line voltages from elsewhere in the integrated circuit to the string select line SSL structures. In prior designs, such as the design shown in FIG. 1, two metal layer layers are required—one metal layer for string select line voltages, and another for ground select line voltages. However, in the shown embodiment, the string select line SSL structures proximate to the top pad and the string select line SSL structures proximate to the bottom pad combine the functions of the older string select line voltages, and older ground select line voltages. Accordingly, in the shown embodiment, a single metal layer is sufficient for performing the string select functions.

Figure 11:
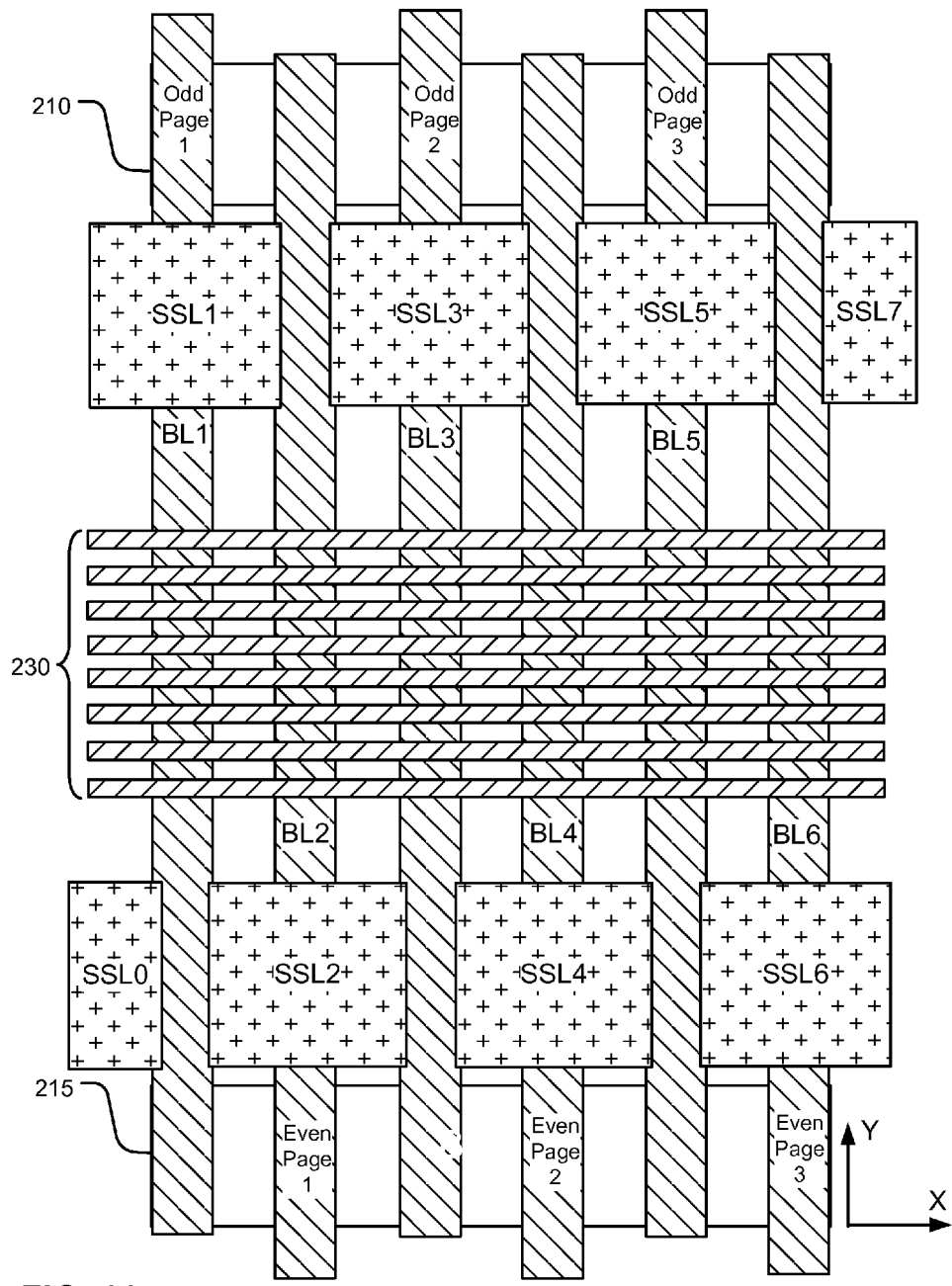
FIG. 11 is a layout view of a first array arrangement for a finger VG (vertical gate) 3D NAND memory device with a split page, and even and odd bit lines accessed by respective pads.

FIG. 11 is a layout view of a first array arrangement for a finger VG (vertical gate) 3D NAND memory device with a split page, and even and odd bit lines accessed by respective pads.

The different layers of upper pad 210 are electrically coupled to every other active strip (e.g. BL1, BL3, BL5), which are odd pages. BL1, BL3, and BL5 are electrically coupled respectively to layer 1, layer 2, and layer 3 of upper pad 210. BL1, BL3, and BL5 are electrically decoupled from layers of lower pad 215.

The different layers of lower pad 215 are electrically coupled to every other active strip (e.g. BL2, BL4, BL6), which are even pages. BL2, BL4, and BL6 are electrically coupled respectively to layer 1, layer 2, and layer 3 of lower pad 215. BL2, BL4, and BL6 are electrically decoupled from layers of upper pad 210.

Some embodiments have an even number of layers, an even number of odd pages, and an even number of even pages (not shown).

Figure 12:
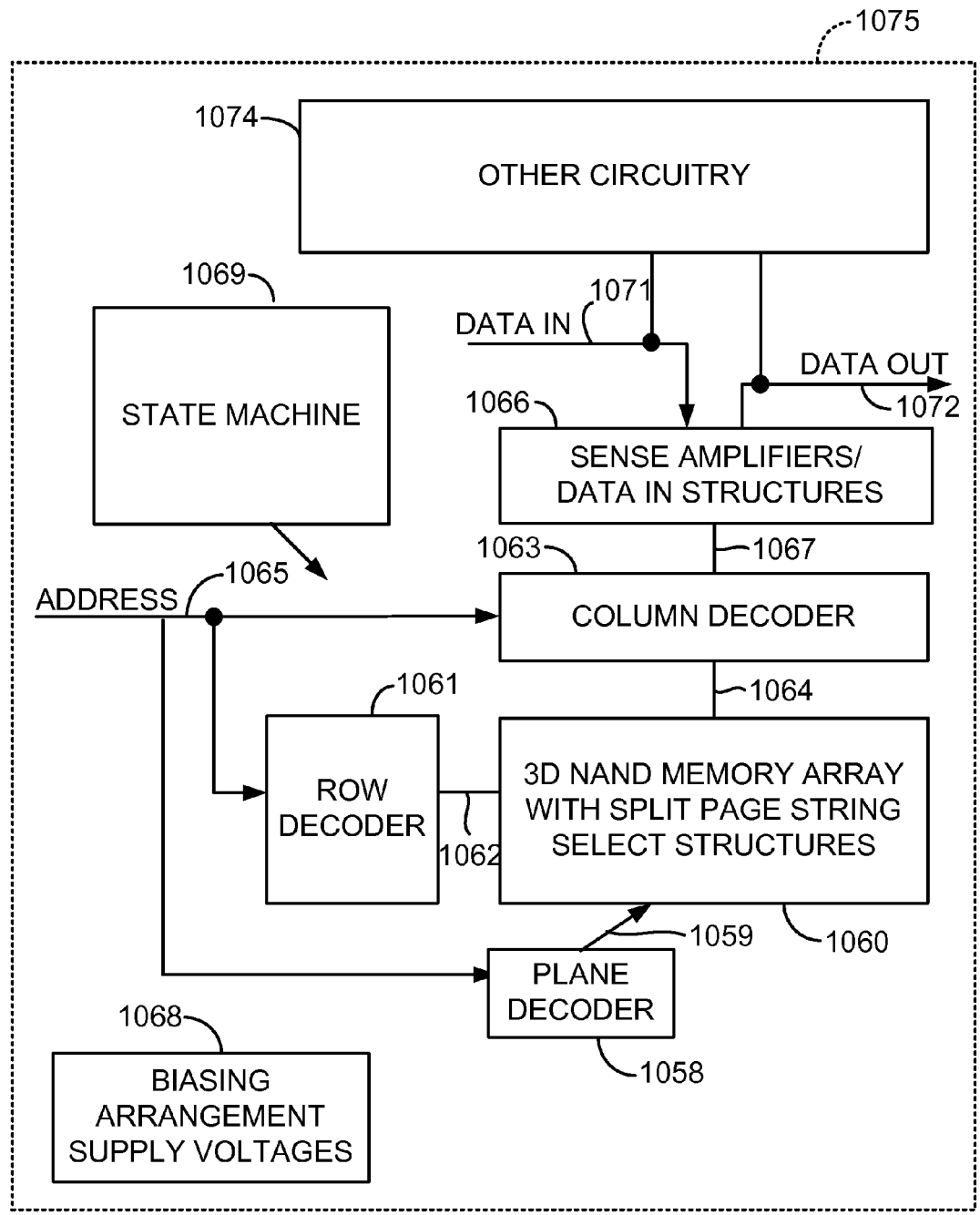
FIG. 12 is a schematic diagram of an integrated circuit including a 3D NAND memory array with split page string select structures.

FIG. 12 is a schematic diagram of semiconductor device including a 3D NAND memory array with split page string select structures according to an embodiment of the present technology. The semiconductor device 1075 includes a 3D NAND flash memory array 1060, implemented as described herein, on a semiconductor substrate with split page string select structures disposed proximate to different pads on opposite ends of the plurality of active strips of NAND strings of memory cells. A row decoder 1061 is coupled to a plurality of word lines 1062, and arranged along rows in the memory array 1060. A column decoder 1063 is coupled to a plurality of SSL lines 1064, including string select structures, arranged along columns corresponding to active strips in the memory array 1060 for reading and programming data from the memory cells in the array 1060. A plane decoder 1058 is coupled to a plurality of planes in the memory array 1060 via bit lines 1059. Addresses are supplied on bus 1065 to column decoder 1063, row decoder 1061 and plane decoder 1058. Sense amplifiers and data-in structures in block 1066 are coupled to the column decoder 1063 in this example via data bus 1067. Data is supplied via the data-in line 1071 from input/output ports on the integrated circuit 1075 or from other data sources internal or external to the integrated circuit 1075, to the data-in structures in block 1066. In the illustrated embodiment, other circuitry 1074 is included on the integrated circuit, such as a general purpose processor or special purpose application circuitry, or a combination of modules providing system-on-a-chip functionality supported by the NAND flash memory cell array. Data is supplied via the data-out line 1072 from the sense amplifiers in block 1066 to input/output ports on the integrated circuit 1075, or to other data destinations internal or external to the integrated circuit 1075.

A controller implemented in this example using bias arrangement state machine 1069 controls the application of bias arrangement supply voltage generated or provided through the voltage supply or supplies in block 1068, such as read, erase, program, erase verify and program verify voltages.

In order to select a particular active strip in the plurality of active strips, the controller can apply the appropriate voltages to a string select structure surrounding an active strip stack proximate to one end of the active strip stack, and to a pair of string select structures acting as side gates proximate to the other end of the active strip stack.

The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An integrated circuit with a memory array, comprising:
a plurality of active strip stacks with memory cells of the memory array, active strip stacks in the plurality of active strip stacks having first ends and second ends;
a first pad in contact with the first ends of one or more of the plurality of active strip stacks;
a second pad in contact with the second ends of one or more of the plurality of active strip stacks;
a plurality of active strip stack selection structures electrically coupled to the plurality of active strip stacks at positions between the first ends and the second ends; and
control circuitry coupled to the first pad and the second pad, wherein:
responsive to receiving a first command to read a first set of the memory cells on the memory array, the control circuitry applies a first set of read voltages to the first pad and the second pad, such that the first pad has a higher voltage than the second pad, and
responsive to receiving a second command to read a second set of the memory cells on the memory array, the control circuitry applies a second set of read voltages to the first pad and the second pad, such that the second pad has a higher voltage than the first pad.

2. The integrated circuit of claim 1,
wherein the first set of voltages includes a bit line voltage applied to the first pad and a source line voltage applied to the second pad, and
wherein the second set of voltages includes the bit line voltage applied to the second pad and the source line voltage applied to the first pad.

3. The integrated circuit of claim 1,
wherein the plurality of active strip stack selection structures includes:
a first set of active strip stack selection structures on a first side of a plurality of word lines; and
a second set of active strip stack selection structures on a second side of the plurality of word lines, and
the control circuitry uses the first set and the second set of active strip stack selection structures to select particular ones of the plurality of active strip stacks for operations.

4. The integrated circuit of claim 3,
wherein the first set of voltages includes a string select line voltage applied to at least one of the first set of active strip stack selection structures, and a ground select line voltage applied to at least one of the second set of active strip stack selection structures, and
wherein the second set of voltages includes the string select line voltage applied to at least one of the second set of active strip stack selection structures, and the ground select line voltage applied to at least one of the first set of active strip stack selection structures.

5. The integrated circuit of claim 3, further comprising:
a first plurality of metal lines carrying one of (i) a plurality of string select line signals and (ii) a plurality of ground select line signals, to the first set of active strip stack selection structures; and
a second plurality of metal lines carrying the other one of (i) the plurality of string select line signals and (ii) the plurality of ground select line signals, to the second set of active strip stack selection structures, wherein first plurality of metal lines and the second plurality of metal lines are at a same metal layer.

6. The integrated circuit of claim 1, wherein the plurality of active strip stacks include a first set of active strip stacks and a second set of active strip stacks interleaved with each other, the first set of active strip stacks electrically coupled to the first pad and electrically decoupled from the second pad, the second set of active strip stacks electrically coupled to the second pad and electrically decoupled from the first pad.

\* \* \* \* \*